United States Patent
Cai

(10) Patent No.: US 12,411,191 B2
(45) Date of Patent: Sep. 9, 2025

(54) MAGNETIC SENSOR, ROTATION ANGLE DETECTION APPARATUS, AND BRAKE SYSTEM USING ROTATION ANGLE DETECTION APPARATUS

(71) Applicant: TDK Corporation, Tokyo (JP)

(72) Inventor: Yongfu Cai, Tokyo (JP)

(73) Assignee: TDK Corporation, Tokyo (JP)

( * ) Notice: Subject to any disclaimer, the term of this patent is extended or adjusted under 35 U.S.C. 154(b) by 190 days.

(21) Appl. No.: 18/338,723

(22) Filed: Jun. 21, 2023

(65) Prior Publication Data

US 2024/0027548 A1 Jan. 25, 2024

(30) Foreign Application Priority Data

Jul. 21, 2022 (JP) .................................. 2022-116003

(51) Int. Cl.
  *G01R 33/09* (2006.01)
  *B60T 17/22* (2006.01)
  *G01D 5/14* (2006.01)

(52) U.S. Cl.
  CPC ............ *G01R 33/093* (2013.01); *B60T 17/22* (2013.01); *G01D 5/145* (2013.01); *G01R 33/091* (2013.01)

(58) Field of Classification Search
  CPC ....... G01R 33/093; G01R 33/09; B60T 17/22; G01D 5/145
  See application file for complete search history.

(56) References Cited

U.S. PATENT DOCUMENTS

| | | | |
|---|---|---|---|
| 7,492,554 B2 * | 2/2009 | Breuer ................. | G11B 5/3951 360/313 |
| 11,274,942 B2 * | 3/2022 | Cai ......................... | G01D 5/145 |
| 11,428,545 B2 * | 8/2022 | Uchida .................... | G01D 3/08 |
| 11,569,143 B2 * | 1/2023 | Cai ..................... | H01L 23/49575 |
| 2017/0241803 A1 * | 8/2017 | Ausserlechner ........ | G01D 5/145 |

FOREIGN PATENT DOCUMENTS

| JP | H09-219546 A | 8/1997 |
|---|---|---|
| JP | 2008-286739 A | 11/2008 |
| JP | 4324813 B2 | 9/2009 |
| JP | 4900838 B2 | 3/2012 |
| JP | 5120384 B2 | 1/2013 |

* cited by examiner

*Primary Examiner* — Reena Aurora
(74) *Attorney, Agent, or Firm* — Posz Law Group, PLC

(57) ABSTRACT

Magnetic sensor 1 has magnetic field detection element 7 that detects a magnetic field that is generated by magnet 2 that rotates about central axis C; and substrate 10 that has first side P1 and second side P2 that is a reverse side of the first side P1, wherein second side P2 includes first slope PK1 that is inclined with respect to first side P1. Magnetic field detection element 7 is provided along first slope PK1. Magnet 2 is separated from central axis C and polarities of magnet 2 alternate in a circumferential direction about central axis C. First side P1 is substantially parallel to central axis C. First slope PK1 is inclined with respect to first side P1 by an average angle of θ. In a plane perpendicular to central axis C, intensity of the magnetic field where magnetic field detection element 7 is positioned changes as magnet 2 rotates, and the relation $(1/Ks) \times 0.8 \leq MFR \leq (1/Ks) \times 1.2 (Ks=\sin\theta)$ is satisfied, where MFR is a ratio of a maximum value to a minimum value of the intensity of the magnetic field in the plane.

14 Claims, 9 Drawing Sheets

MAGNETIC SENSOR, ROTATION ANGLE DETECTION APPARATUS, AND BRAKE SYSTEM USING ROTATION ANGLE DETECTION APPARATUS

FIELD

The present application is based on, and claims priority from, JP2022-116003, filed on Jul. 21, 2022, the disclosure of which is hereby incorporated by reference herein in its entirety.

The present disclosure relates to a magnetic sensor, a rotation angle detection apparatus, and a brake system using the rotation angle detection apparatus.

BACKGROUND

A magnetic sensor is known that detects the rotation angle of a magnet that rotates about a central axis thereof. As the magnet rotates, the intensity and the direction of a magnetic field (a magnetic field vector) that is generated by the magnet draw a Lissajous figure about the position where magnetic sensor is provided. JP4900838 discloses a magnetic sensor that is arranged such that a generally circular Lissajous figure is drawn. The magnetic sensor disclosed in JP4900838 is arranged such that it is inclined with respect to the central axis of the magnet.

SUMMARY

A magnetic sensor of the present disclosure comprises: a first magnetic field detection element that detects a magnetic field that is generated by a magnet that rotates about a central axis; and a substrate that has a first side and a second side that is a reverse side of the first side, wherein the second side includes a first slope that is inclined with respect to the first side. The first magnetic field detection element is provided along the first slope. The magnet is separated from the central axis and polarities of the magnet alternate in a circumferential direction about the central axis. The first side is substantially parallel to the central axis. The first slope is inclined with respect to the first side by an average angle of $\theta$. In a plane perpendicular to the central axis, intensity of the magnetic field where the first magnetic field detection element is positioned changes as the magnet rotates, and the relation $$(1/Ks) \times 0.8 \leq MFR \leq (1/Ks) \times 1.2 \, (Ks = \sin\theta)$$

is satisfied, where MFR is a ratio of a maximum value to a minimum value of the intensity of the magnetic field in the plane.

The above and other objects, features and advantages of the present invention will become apparent from the following description with reference to the accompanying drawings that illustrate examples of the present invention.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
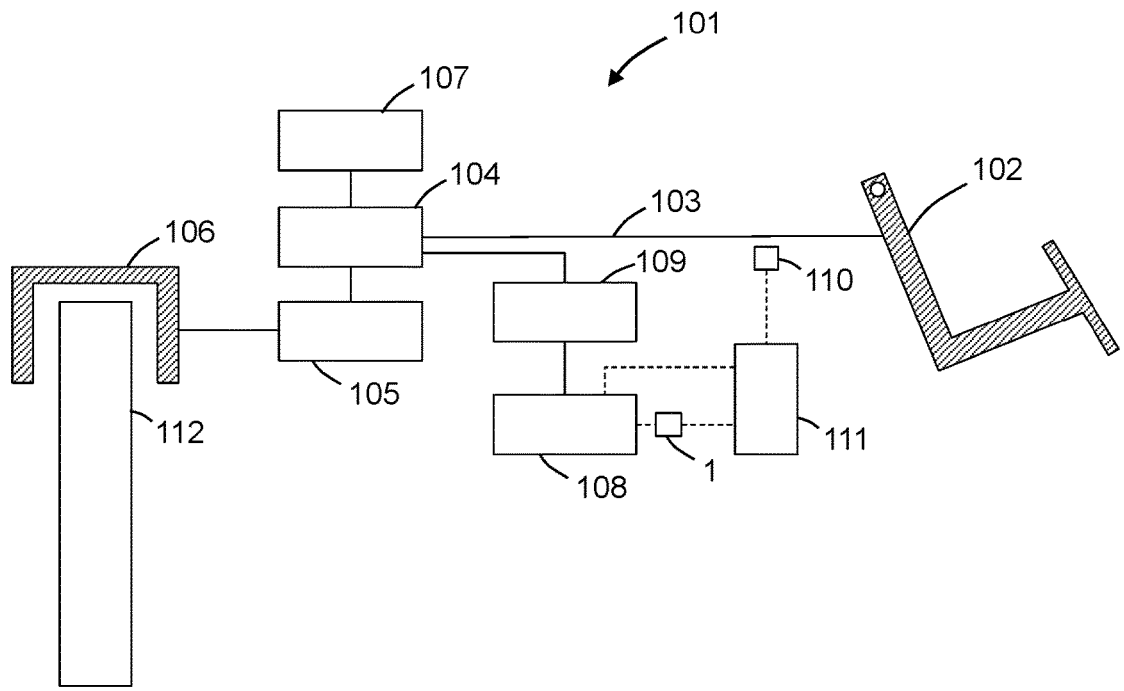
FIG. 1 is a schematic diagram illustrating the configuration of a brake system according to an embodiment of the present disclosure.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions.

As described above, the magnetic sensor described in JP4900838 is arranged such that it is inclined with respect to the central axis of the magnet and the mounting structure therefore tends to be complex. In general, it is preferable for a magnetic sensor to be mounted substantially parallel to or substantially perpendicular to the central axis of the magnet. However, it is difficult for a magnetic sensor that is mounted in this manner to limit error in detecting angles because the Lissajous figure of a magnetic field deviates from a perfect circle.

Embodiments of the present disclosure will be described with reference to the drawings. FIG. 1 schematically illustrates an example of brake system 101 to which the magnetic sensor of the present disclosure is applied. Brake system 101 has brake pedal 102, master cylinder 104 that is connected to brake pedal 102 via connecting element 103, hydraulic control circuit 105 that is connected to master cylinder 104, and caliper 106 that is connected to hydraulic control circuit 105. Reservoir tank 107 is connected to master cylinder 104.

Motor 108 is connected to master cylinder 104 via gear train 109. The displacement of brake pedal 102 is detected by stroke sensor 110 and is sent to control unit 111. The number of rotations of motor 108 is detected by magnetic sensor 1 (rotation angle sensor) and is sent to control unit 111. Control unit 111 controls the rotation of motor 108 in accordance with the displacement of brake pedal 102. The braking force inputted from brake pedal 102 is amplified by motor 108 and is transmitted to hydraulic control circuit 105. Therefore, motor 108 operates as an electric booster. Hydraulic control circuit 105 supplies brake oil to caliper 106 in accordance with the amount of depression of brake pedal 102. Caliper 106 brakes brake disc 112.

Figure 2:
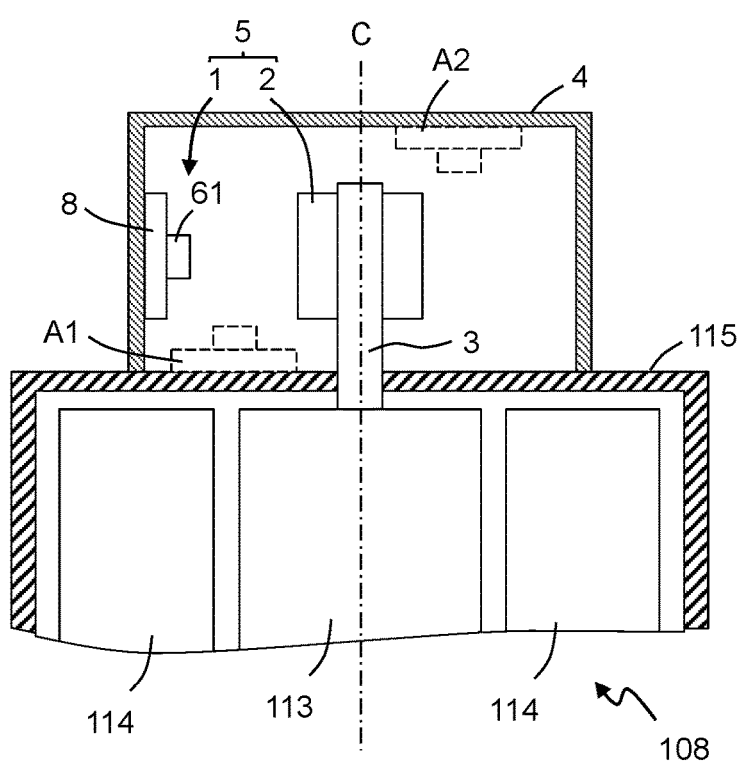
FIG. 2 is a view schematically illustrating the arrangement of a magnetic sensor, a magnet, and a motor.

FIG. 2 schematically illustrates the arrangement of magnetic sensor 1, magnet 2, and motor 108. Motor 108 has rotor 113 and stator 114. Rotor 113 and stator 114 are housed in motor casing 115. Rotor 113 has rotating shaft 3 that rotates about central axis C. Ring-shaped magnet 2 that is concentric with rotating shaft 3 is provided on the side surface of the end portion of rotating shaft 3. Magnet 2 is provided away from central axis C. The polarities of magnet 2 alternate in the circumferential direction about central axis C. Specifically, the N poles and the S poles are alternately arranged in the circumferential direction about central axis C. The number of the N poles and the S poles is not limited, and at least one pair of an N pole and an S pole may be provided. Four pairs of N poles and S poles are provided in the present embodiment. Magnet 2 rotates together with rotor 113 and the magnetic field that is generated by magnet 2 rotates together with rotating shaft 3.

Magnetic sensor 1 that detects the rotation angle of magnet 2, and accordingly the rotation angle of rotating shaft 3 and motor 108, is arranged near magnet 2. Magnetic sensor 1 and magnet 2 are housed in sensor housing 4 that is fixed to motor casing 115. Magnetic sensor 1 and magnet 2 constitute rotation angle detection apparatus 5 for motor 108. Magnetic sensor 1 has sensor package 61 and electric wiring member 8 to which sensor package 61 is attached. Electric wiring member 8 is formed, for example, of a printed circuit board.

Figure 3:
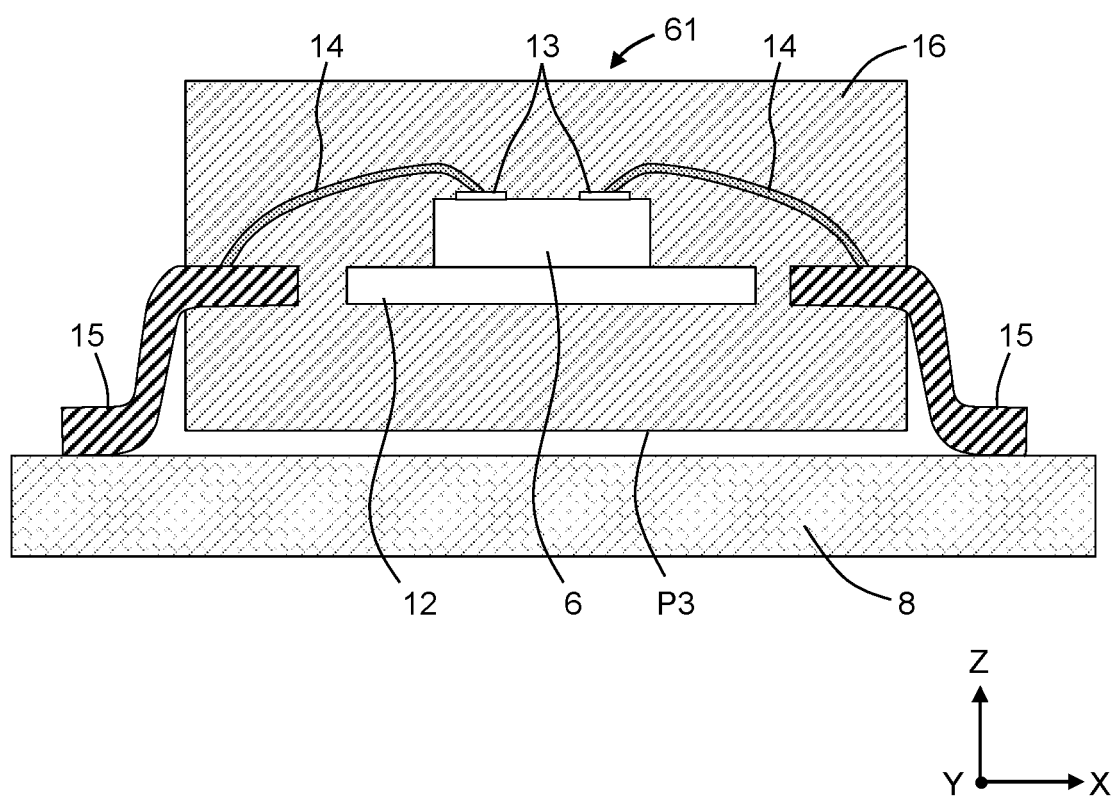
FIG. 3 is a view schematically illustrating the arrangement of a magnetic sensor.

FIG. 3 schematically illustrates the arrangement of magnetic sensor 1. Sensor package 61 has base 6, support member 12 that supports base 6, electric connection pads 13 that are provided on base 6, leads 14 that are connected to electric connection pads 13, and electric connections 15 that are connected to leads 14. Base 6, support member 12, electric connection pads 13 and leads 14 are encapsulated with resin 16, and a part of electric connections 15 is also encapsulated within resin 16. Resin 16 forms the outer surfaces of sensor package 61. Sensor package 61 generally has the shape of a cuboid. The parts of electric connections 15 outside of resin 16 are connected to electric wiring member 8. Sensor package 61 is attached to electric wiring member 8 by electric connections 15. Surface P3 of sensor package 61 that faces electric wiring member 8 is separated from electric wiring member 8.

Figure 4A:
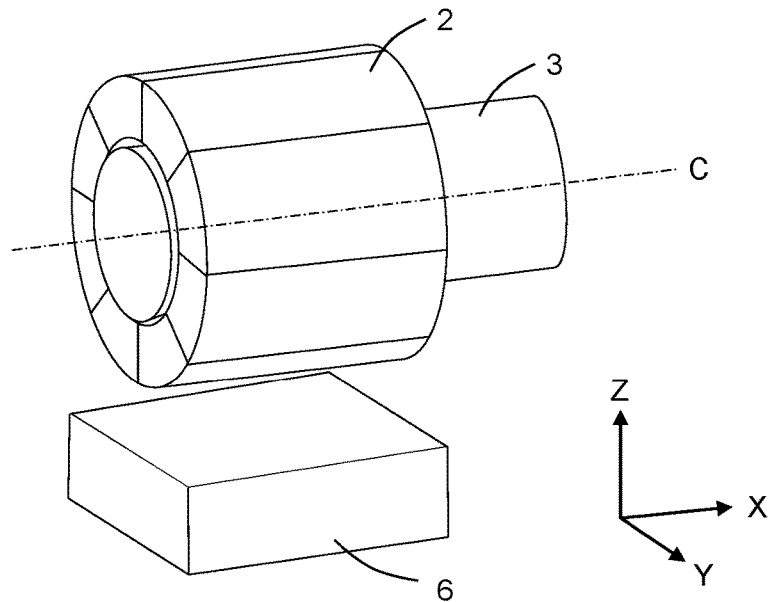
FIGS. 4A and 4B are views schematically illustrating the arrangement of a magnetic sensor, a magnet, and a rotating shaft of a first embodiment of the present disclosure.
Figure 4B:
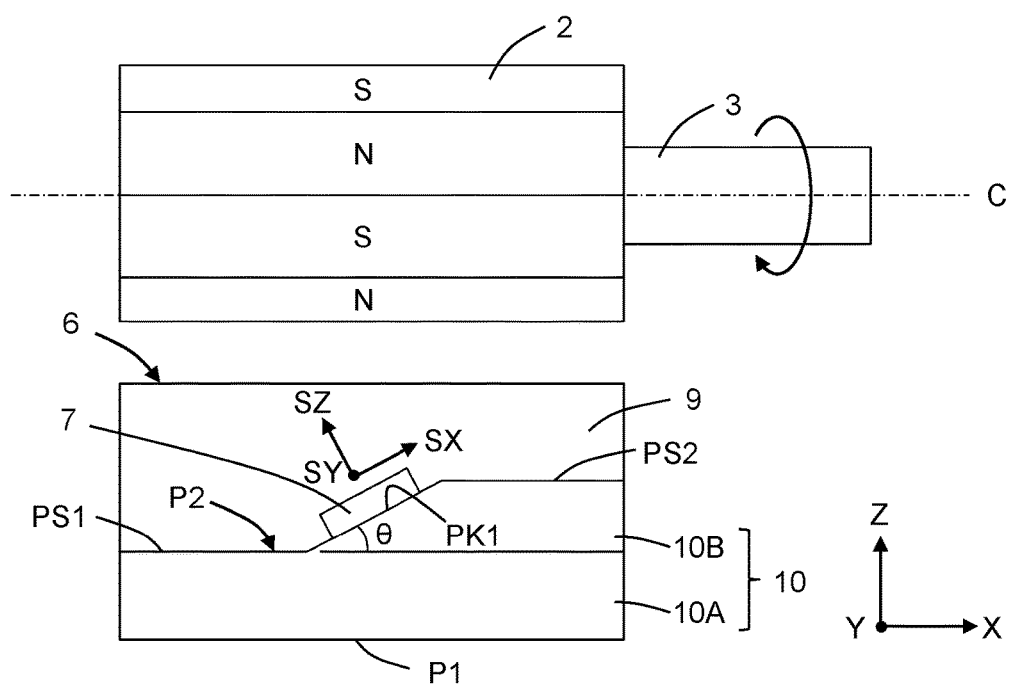
Figure 5:
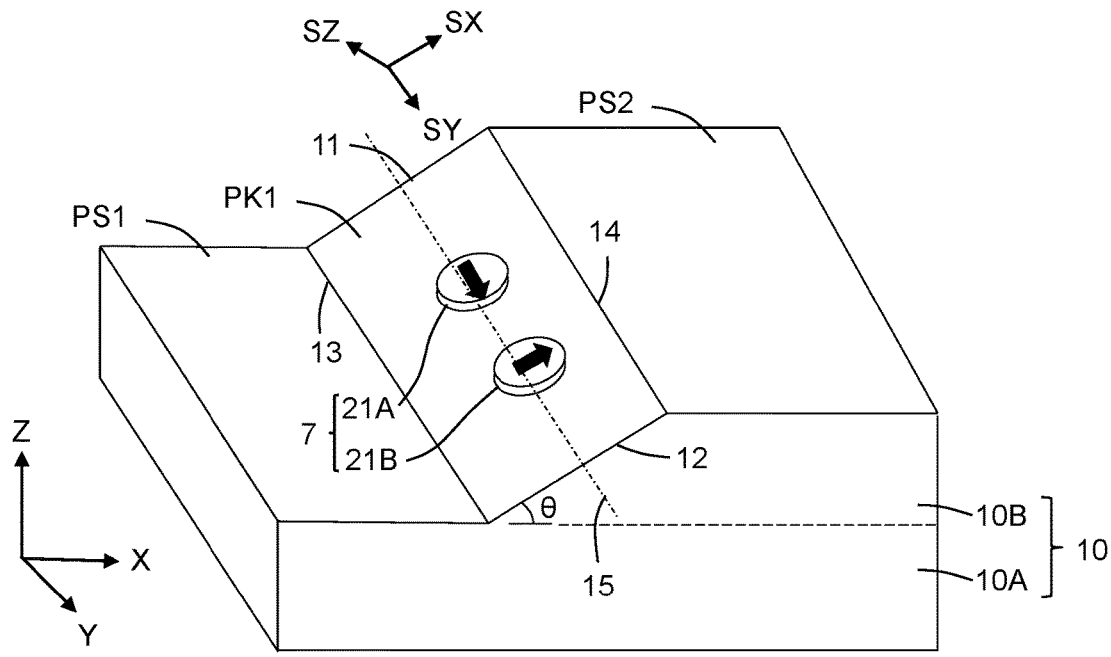
FIG. 5 is a perspective view of a magnetic field detection element and a substrate.

FIGS. 4A and 4B schematically illustrate the arrangement of base 6 of magnetic sensor 1, magnet 2, and rotating shaft 3. It should be noted that for convenience of illustration, these elements may not be illustrated to scale. FIG. 4A is a perspective view and FIG. 4B is a side view as seen in the Y-direction. FIG. 5 illustrates a perspective view of magnetic field detection element 7 and substrate 8. Base 6 generally has the shape of a cuboid. Base 6 houses magnetic field detection element 7. Magnetic field detection element 7 is electrically connected to electric wiring member 8. Magnetic field detection element 7 detects a magnetic field that is generated by magnet 2 that rotates about central axis C.

Two coordinate systems that are used in the present embodiment are now described. One is the SX-SY-SZ Cartesian coordinate system for magnetic field detection element 7. The SX-axis, the SY-axis, and the SZ-axis are perpendicular to each other. The SX-axis and the SY-axis correspond to the magnetic field detection axes of magnetic field detection element 7. The SX-axis is perpendicular to center line 15 of first slope PK1 (see FIG. 5), and the SY-axis is parallel to center line 15 of first slope PK1. The SZ-axis is perpendicular to each of layers that form magnetic field detection element 7 (for example, magnetically pinned layer 24 and magnetically free layer 26, described later) and is therefore perpendicular to the two magnetic field detection axes of magnetic field detection element 7.

The other coordinate system is the X-Y-Z Cartesian coordinate system for rotating shaft 3 and base 6. The X-axis, the Y-axis and the Z-axis are perpendicular to each other. The X-axis is parallel to central axis C of rotating shaft 3, and the Y-axis and the Z-axis are perpendicular to rotating shaft 3. The Y-axis coincides with the SY-axis. The Z-axis is parallel to the thickness direction of base 6 and is perpendicular to the mounting surface of base 6 (first side P1). The thickness of base 6 is referred to as the minimum distance between opposite surfaces of base 6 out of sets of opposite surfaces of base 6. The external magnetic field that is generated by magnet 2 rotates in the Y-Z plane, and since the external magnetic field substantially contains only components parallel to the Y-Z plane, the magnetic field component in the X-axis direction can be regarded to be substantially zero.

Base 6 has substrate 10 that supports magnetic field detection element 7. Substrate has first portion 10A that is formed of silicon or the like and second portion 10B that is formed of resist or the like and that has first slope PK1, described later. First portion 10A has a substantially constant thickness in the Z-direction. Second portion 10B is formed on first portion 10A. All parts of substrate 10 may be formed by etching a silicon substrate or the like.

Substrate 10 has flat first side P1 and second side P2 that is the reverse side of first side P1. First side P1 is a part of the outer surfaces of base 6 (one surface of the cuboid), and second side P2 is an internal surface of base 6. Second side P2 and magnetic field detection element 7 are covered with insulating layer 9. Sensor package 61 is supported by electric wiring member 8 such that surface P3 faces electric wiring member 8. Electric wiring member 8, surface P3 of sensor package 61 and first side P1 of substrate 10 are substantially parallel to central axis C or the X-Y plane. The wording "substantially parallel" means that first side P1 and central axis C are parallel to each other or that an acute angle formed between a plane that includes first side P1 and central axis C is 5 degrees or less.

Second side P2 has first and second reference surfaces PS1 and PS2 that are parallel to first side P1 and first slope PK1 that is inclined with respect to first side P1. First slope PK1 is also inclined with respect to first and second reference surfaces PS1 and PS2. First and second reference surfaces PS1 and PS2 and first slope PK1 are flat. First slope PK1 is parallel to the SX-SY plane. First slope PK1 is between first reference surface PS1 and second reference surface PS2 and is connected to both first reference surface PS1 and second reference surface PS2.

First slope PK1 has four linear sides 11 to 14. Sides 11 and 12 are opposite and parallel to each other, and sides 13 and 14 are opposite and parallel to each other. Each of sides 11 and 12 connects first reference surface PS1 to second reference surface PS2. Side 13 connects first slope PK1 to first reference surface PS1 and side 14 connects first slope PK1 to second reference surface PS2. First slope PK1 has a constant shape in the Y-direction and has the same inclination at any point in the Y-direction. First slope PK1 is inclined with respect to first side P1 at an average angle θ. Average angle θ is an acute angle that is formed between first side P1 and the plane that includes sides 13 and 14. In the present embodiment, the plane that connects side 13 to side 14 coincides with first slope PK1. First slope PK1 has linear center line 15 that connects the midpoints of sides 11 and 12. Center line 15 is parallel to both the Y-axis and the SY-axis.

As shown in FIG. 5, magnetic field detection element 7 has first and second magneto-resistive effect elements (hereinafter referred to as first MR element 21A and second MR element 21B). The number of MR elements is not limited and magnetic field detection element 7 may have more than one MR element.

Figure 6:
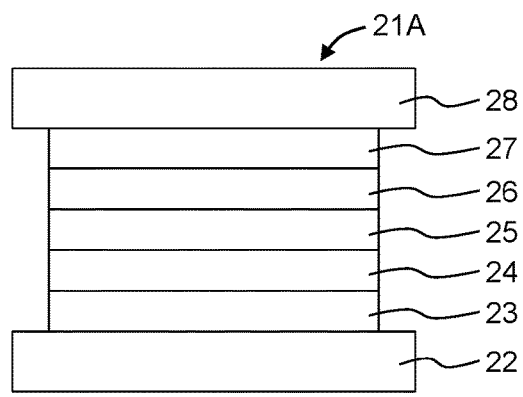
FIG. 6 is a view schematically illustrating the layer configuration of an MR element.

FIG. 6 schematically illustrates the layer configuration of first MR element 21A. Since second MR element 21B has the same layer configuration as first MR element 21A, redundant description will be omitted. First MR element 21A includes magnetically pinned layer 24 whose magnetization direction is pinned, magnetically free layer 26 whose magnetization direction changes in accordance with a magnetic field, and spacer layer 25 that is arranged between magnetically pinned layer 24 and magnetically free layer 26. First MR element 21A may be a TMR (tunneling magneto-resistive effect) element in which spacer layer 25 is a tunneling barrier layer or may be a GMR (gigantic magneto-resistive effect) element in which spacer layer 25 is a nonmagnetic conductive layer. Magnetically pinned layer 24, spacer layer 25 and magnetically free layer 26 are sandwiched between lower electrode 22 and upper electrode 28 that supply a sensing current. First MR element 21A further includes seed layer 23 that is positioned between magnetically pinned layer 24 and lower electrode 22, and capping layer 27 that is positioned between magnetically free layer 26 and upper electrode 28.

The magnetization direction of magnetically free layer 26 changes in accordance with the angle of an external magnetic field. The shape of magnetically free layer 26 (the shape in the SX-SY plane, described later) may be a circle or an ellipse. In the case of an ellipse, the long axis and the short axis of the ellipse are preferably substantially parallel to and substantially perpendicular to (or substantially perpendicular to and substantially parallel to) center line 15, respectively. In the case of an ellipse, conversion coefficient Ks, described later, may be finely adjusted by changing the ratio of the length of the long axis and the length of the short axis. The resistance of each of first and second MR elements 21A and 21B changes in accordance with the angle that is formed between the magnetization direction of magnetically free layer 26 and the magnetization direction of magnetically pinned layer 24. The resistance is minimized when the angle is 0 degrees and is maximized when the angle is 180 degrees. First and second MR elements 21A and 21B can detect the direction of the external magnetic field based on this principle.

FIG. 5 illustrates the magnetization direction of magnetically pinned layer 24 with the bold arrows. The magnetization direction of magnetically pinned layer 24 of first MR element 21A and the magnetization direction of magnetically pinned layer 24 of second MR element 21B are directed in different directions, preferably perpendicular to each other. The magnetization direction of each magnetically pinned layer 24 is substantially parallel to or substantially perpendicular to center line 15 of first slope PK1. Specifically, the magnetization direction of magnetically pinned layer 24 of first MR element 21A is substantially parallel to center line 15 (the SY-axis and the Y-axis) and the magnetization direction of magnetically pinned layer 24 of second MR element 21B is substantially perpendicular to center line 15 (parallel to the SX-axis). The magnetization directions of magnetically free layers 26 of first MR element 21A and second MR element 21B coincide due to the external magnetic field. Since the magnetization directions of magnetically pinned layers 24 of first MR element 21A and second MR element 21B are perpendicular to each other, the outputs of first MR element 21A and second MR element 21B have a phase difference of 90 degrees. For example, when the output of first MR element 21A is a sine wave, the output of second MR element 21B is a cosine wave having the same phase as the sine wave. The direction of the external magnetic field can be obtained by calculating the arctangent from the output of the sine wave and the output of the cosine wave.

Since first MR element 21A and second MR element 21B are arranged close to each other, the intensity and the direction of the magnetic field that is applied to first MR element 21A and second MR element 21B can be regarded as being substantially the same. Thus, magnetic field detection element 7 has two magnetic field detection axes that are directed in different directions, and preferably, that are perpendicular to each other. Magnetic field detection element 7 has magnetic field detection axes in the SX-axis and in the SY-axis and therefore cannot detect a magnetic component in the SZ-direction. In other words, magnetic field detection element 7 has a magnetic field detection plane that includes the SX-axis and the SY-axis.

Here, the intensities of the magnetic fields $H_{SX}$, $H_{SY}$, and $H_{SZ}$ in the SX-, SY-, and SZ-directions, respectively, at the position where magnetic field detection element 7 is positioned are defined as follows:

$$H_{SX} = H_X \cos\theta + H_Z \sin\theta \quad \text{(formula 1)}$$

$$H_{SZ} = H_X \sin\theta + H_Z \cos\theta \quad \text{(formula 2)}$$

$$H_{SY} = H_Y \quad \text{(formula 3)}$$

where $H_X$, $H_Y$, and $H_Z$ are the intensities of the magnetic fields in the X-, Y-, and Z-directions, respectively, at the position where magnetic field detection element 7 is positioned, and θ is the above-mentioned average angle θ, that is, the acute angle that is formed between first slope PK1 and first side P1 (or first and second reference surfaces PS1 and PS2).

The intensities of the magnetic fields at the position where magnetic field detection element 7 is positioned change as magnet 2 rotates. The vector of the magnetic field (a vector having the intensity and the direction of the magnetic field) at the position where magnetic field detection element 7 is positioned also changes as magnet 2 rotates. If the starting point of the vector is fixed, then the end point of the vector rotates and thus draws a Lissajous figure as magnet 2 rotates. The ratio of the maximum value of the intensity of the magnetic field in the Lissajous figure (the maximum diameter of the Lissajous figure) to the minimum value of the intensity of the magnetic field in the Lissajous figure (the minimum diameter of the Lissajous figure) is referred to as MFR. When the intensity of the magnetic field is constant (MFR=1), the Lissajous figure is a perfect circle. When the intensity of the magnetic field changes (MFR>1), the Lissajous figure is an ellipse.

Figure 7A:
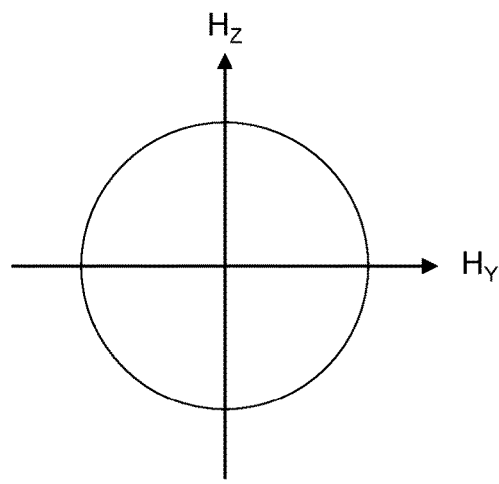
FIGS. 7A to 7D are Lissajous figures of an external magnetic field of the first embodiment of the present disclosure and a comparative example.
Figure 7B:
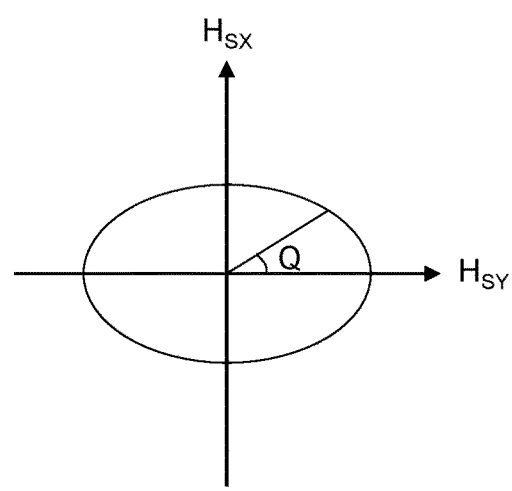

The magnetic field that is generated by the rotation of magnet 2 can be easily comprehended in the X-Y-Z coordinate system, while the magnetic field that is applied to magnetic field detection element 7 can be easily comprehended in the SX-SY-SZ coordinate system. Thus, the two coordinate systems are referred to in the following description. FIG. 7A illustrates a Lissajous figure of an external magnetic field in the Y-Z plane in a comparative example. The Lissajous figure is a perfect circle (MFR=1), and the intensity of the magnetic field in the Y-Z plane is constant at the position where magnetic field detection element 7 is positioned. FIG. 7B illustrates a Lissajous figure of the external magnetic field in the SX-SY plane in the comparative example. As described above, $H_X=0$. Therefore, from formulas (1) and (3):

$$H_{SX}=H_Z \sin \theta \quad \text{(formula 4)}$$

$$H_{SY}=H_Y \quad \text{(formula 5)}$$

Accordingly, the Lissajous figure in the SX-SY plane, that is, the Lissajous figure of the magnetic field that is detected by magnetic field detection element 7, becomes an ellipse.

The rotation angle Q of magnet 2 is calculated as follows:

$$Q=a \tan(H_{SX}/H_{SY})=a \tan(\sin \theta \times (H_Z/H_Y))=a \tan(K_S \times (H_Z/H_Y)) \quad \text{(formula 6)}$$

where $K_S$ is a conversion coefficient for converting the intensity of the magnetic field in the Z-axis direction in the Y-Z plane into the intensity of the magnetic field in the SX-axis direction in the SX-SY plane and is equal to $\sin \theta$.

Figure 8A:
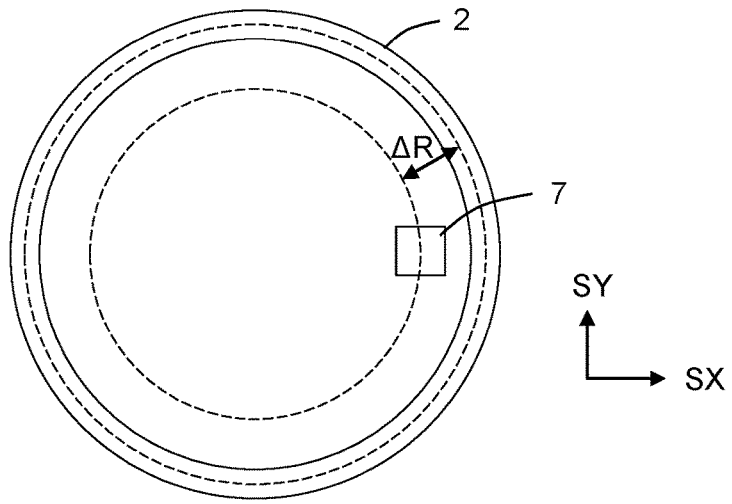
FIGS. 8A to 8C are views illustrating the relationship between Max ($H_{SY}$)/Max ($H_{SX}$) and error in detecting angles.
Figure 8B:
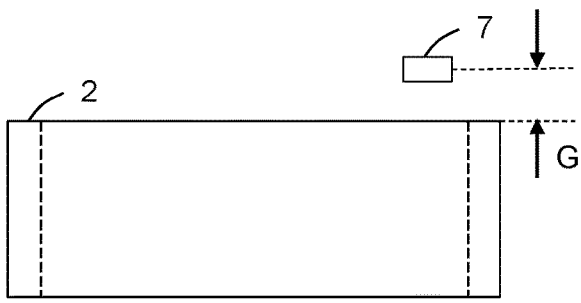

The relationship between Max $(H_{SY})$/Max $(H_{SX})$ and the error in detecting angles was obtained by calculation. FIG. 8A illustrates a plan view of magnetic field detection element 7 and ring-shaped magnet 2, and FIG. 8B illustrates a side view of FIG. 8A. The rotating magnetic field that is generated by magnet 2 was obtained by simulating the magnetic field. Max $(H_{SY})$/Max $(H_{SX})$ at the position of the MR element of magnetic field detection element 7 (distance $\Delta R$ in the radial direction from the center line of magnet 2 and distance G in the axial direction from the end surface of magnet 2) can be obtained based on the simulation results of the magnetic field. In addition, the error in detecting angles at the position of the MR element can be obtained by obtaining the difference between angle Q that is calculated based on the simulation results of the magnetic field and the actual rotation angle of magnet 2. Max $(H_Y)$/Max $(H_X)$ and the error in detecting angles were obtained in this manner at various positions and their relationship was plotted. The relationship between Max $(H_{SY})$, Max $(H_{SX})$, and MFR is as follows:

$$MFR=\text{Max}(\text{Max}(H_{SY})/\text{Max}(H_{SX}), \text{Max}(H_{SX})/\text{Max}(H_{SY}))$$

Figure 8C:
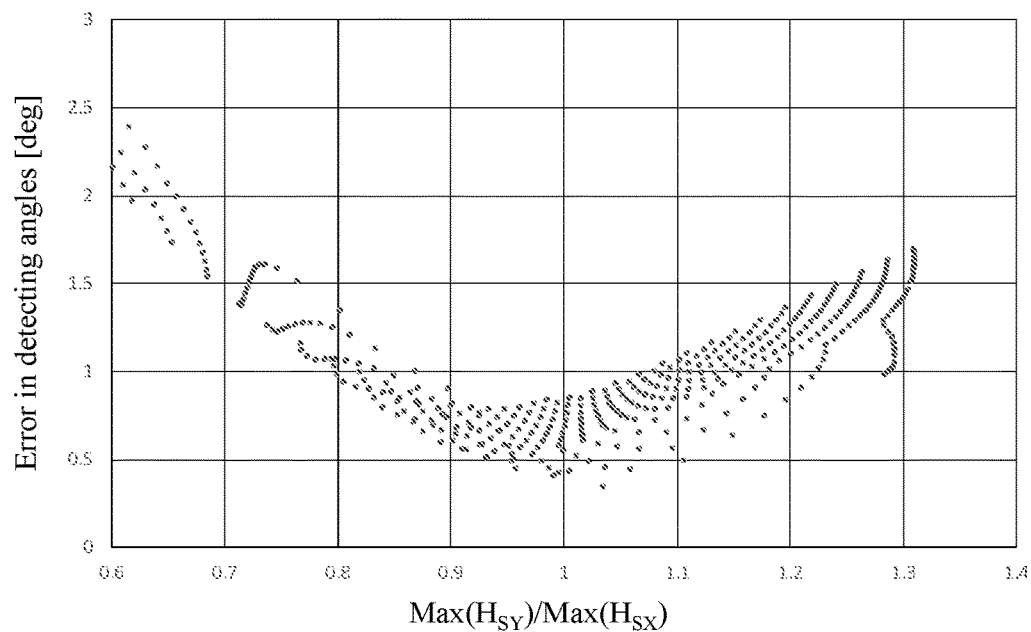

FIG. 8C shows the calculation results. When Max $(H_{SY})$/Max $(H_{SX})$ is close to 1, the error in detecting angles is small, and when the difference between Max $(H_{SY})$/Max $(H_{SX})$ and 1 is large, the error in detecting angles becomes large. In other words, as the Lissajous figure approaches a perfect circle in the magnetic field detection plane of magnetic field detection element 7 (in the SX-SY plane), the error in detecting the angle of magnetic sensor 1 decreases, and as the Lissajous figure deviates from a perfect circle, the error in detecting the angle of magnetic sensor 1 increases. The comparative example shows that the Lissajous figure of an external magnetic field that is a perfect circle in the Y-Z plane becomes an ellipse in the magnetic field detection plane (in the SX-SY plane) due to the influence of Ks, and the error in detecting the angle of magnetic sensor 1 increases.

Figure 7C:
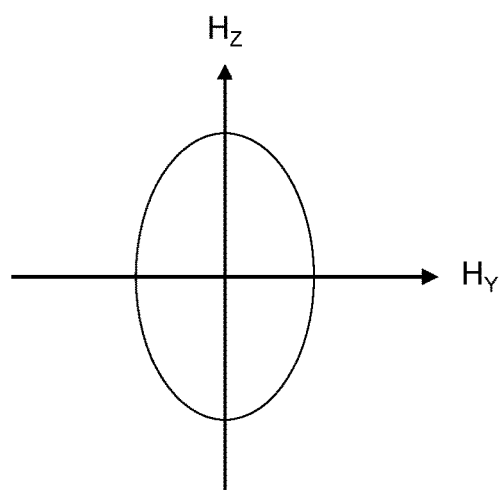
Figure 7D:
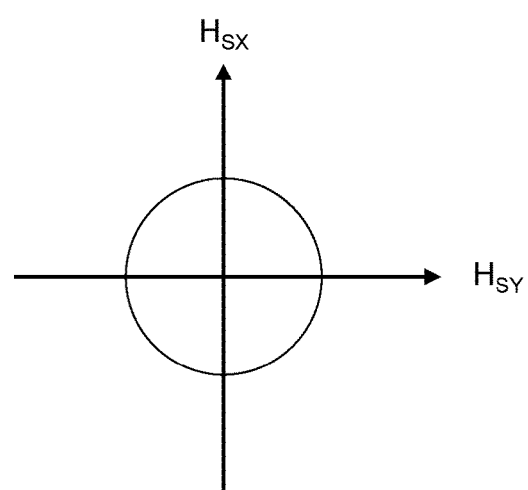

FIG. 7C illustrates a Lissajous figure of an external magnetic field (in the Y-Z plane) of the present embodiment. FIG. 7D illustrates a Lissajous figure of the external magnetic field (in the SX-SY plane) of the present embodiment. Since MFR>1, the Lissajous figure in the Y-Z plane is an ellipse. However, since Ks=$\sin \theta$, the Lissajous figure in the SX-SY plane is a perfect circle. In this manner, the error in detecting the angle of magnetic sensor 1 decreases due to $K_S$ in the present embodiment. In other words, magnetic sensor 1 of the present embodiment holds conversion coefficient $K_S$ without a special circuit.

In addition, as can be understood from FIG. 7C, the positions at which Max $(H_{SY})$/Max $(H_{SX})$=1 (the combination of distance $\lambda R$ in the radial direction and distance G in the axial direction) are limited. In other words, Max $(H_{SY})$/Max $(H_{SX})$ is not equal to 1 in most cases. In the present embodiment, Max $(H_{SY})$/Max $(H_{SX})$ is easily set to 1 by adjusting $\theta$. Specifically, $\theta$ can be used as a parameter in addition to distance $\Delta R$ in the radial direction and distance G in the axial direction, and as a result, the number of combinations of distance $\Delta R$ in the radial direction and distance G in the axial direction that satisfy Max $(H_{SY})$/Max $(H_{SX})$=1 increases. Accordingly, magnetic sensor 1 (sensor package 61) can be arranged in a larger number of positions and the degree of freedom of the arrangement is enhanced.

Based on the above, it is ideally preferable that MFR be equal to (1/Ks) in the Y-Z plane. However, the error in detecting the angle of magnetic sensor 1 can be reduced if this relationship is approximately satisfied. Accordingly, in the present embodiment, (1/Ks)×0.8≤MFR≤(1/Ks)×1.2; and preferably, (1/Ks)×0.9≤MFR≤(1/Ks)×1.1; and more preferably (1/Ks)×0.95≤MFR≤(1/Ks)×1.05, where $K_S$=$\sin \theta$. This relationship can be satisfied, for example, by appropriately selecting the position of magnetic field detection element 7.

As described above, first slope PK1 is inclined with respect to first side P1 such that $(1/K_S)$ is close to MFR in the present embodiment, and the error in detecting the angle of magnetic sensor 1 therefore decreases. Further, since first side P1 is substantially parallel to central axis C of rotating shaft 3, the magnetic sensor can be mounted more easily. For example, as shown in FIG. 2, magnetic sensor 1 may be mounted on, of the walls of sensor housing 4, one of the walls that are parallel to central axis C. When magnetic sensor 1 is mounted so as to be inclined with respect to central axis C, the mounting surface of sensor housing 4 needs to be inclined and the mounting structure becomes complex. Further, in the present embodiment, since magnetic sensor 1 can be efficiently housed in sensor housing 4, an increase in the size and cost of sensor housing 4 as well as of brake system 101 can be easily limited.

Second Embodiment

Figure 9A:
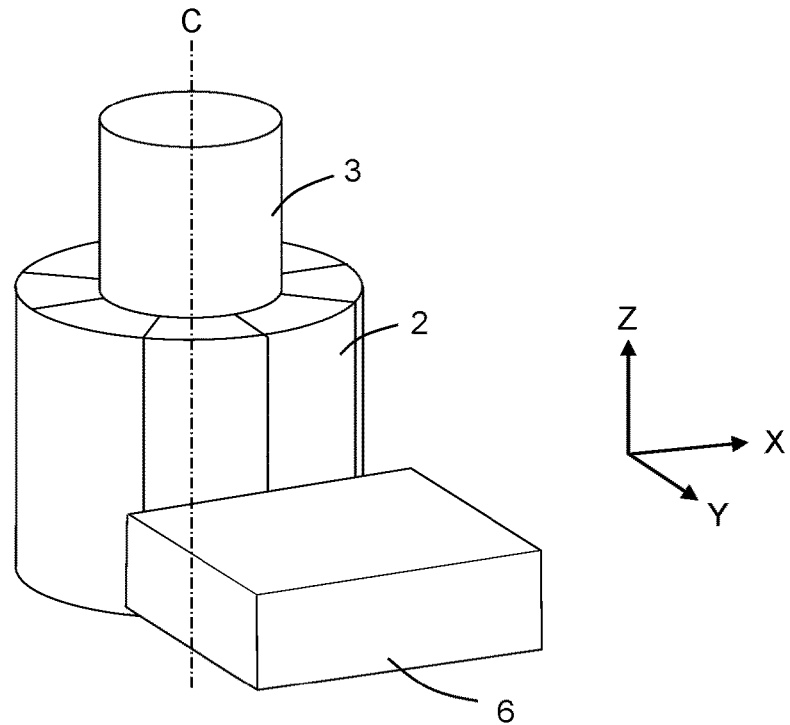
FIGS. 9A and 9B are views schematically illustrating the arrangement of a magnetic sensor, a magnet, and a rotating shaft of a second embodiment of the present disclosure.
Figure 9B:
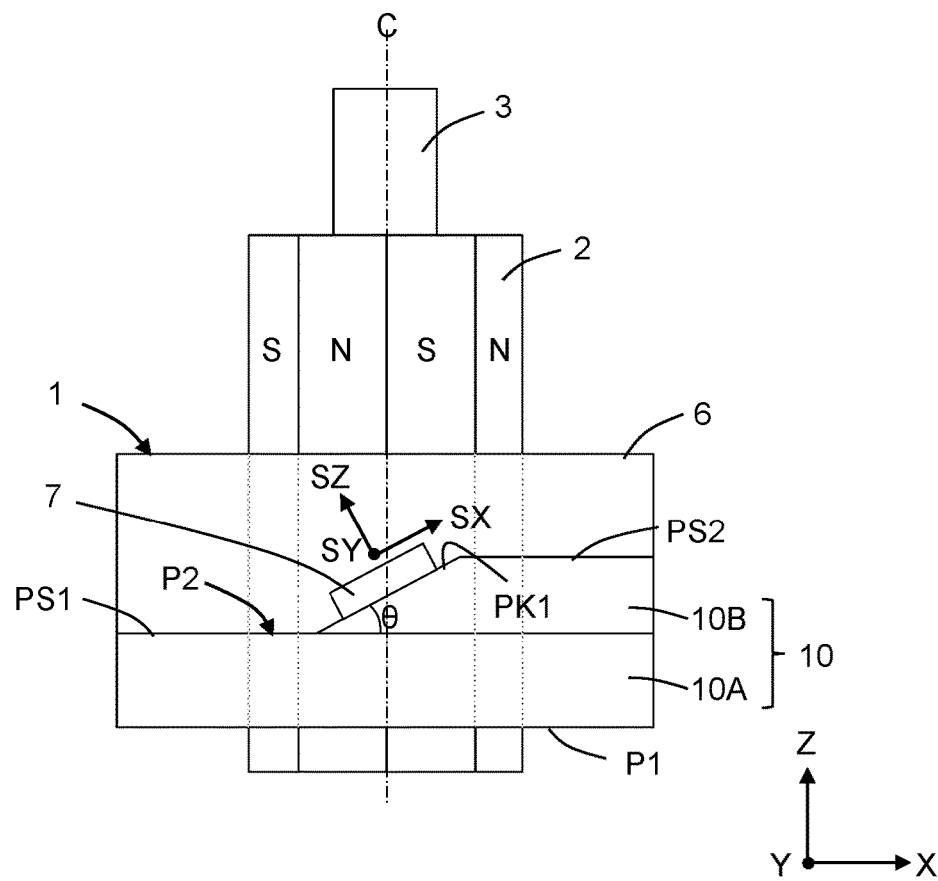

FIGS. 9A and 9B are views similar to FIG. 3 and illustrate the second embodiment of the present disclosure. In the X-Y-Z coordinate system of the present embodiment, the Z-axis is parallel to central axis C of rotating shaft 3, and the X-axis and the Y-axis are perpendicular to rotating shaft 3. That is, the X-axis and the Z-axis are exchanged as compared to the first embodiment. Further, the plane that includes first side P1 (the X-Y plane) is substantially perpendicular to central axis C and the magnetic field component in the Z-axis direction can be regarded as substantially zero. The second embodiment is the same as the first embodiment except for these differences. "Substantially perpendicular" means that the angle formed between the plane that includes first side P1 and central axis C is 85 degrees or more and 95 degrees or less.

$H_{SX}$, $H_{SY}$, $H_{SZ}$, $H_X$, $H_Y$, $H_Z$ and θ are defined in the same manner as in the first embodiment. $H_{SX}$, $H_{SY}$, $H_{SZ}$ are defined as follows:

$$H_{SX} = H_X \cos\theta + H_Z \sin\theta \quad \text{(formula 7)}$$

$$H_{SZ} = -H_X \sin\theta + H_Z \cos\theta \quad \text{(formula 8)}$$

$$H_{SY} = H_Y \quad \text{(formula 9)}.$$

Since $H_Z = 0$, from above formulas (7) and (9):

$$H_{SX} = H_X \cos\theta \quad \text{(formula 10)}$$

$$H_{SY} = H_Y \quad \text{(formula 11)}$$

Accordingly, the Lissajous figure in the SX-SY plane, that is, the Lissajous figure of a magnetic field that is detected by magnetic field detection element 7, is a perfect circle.

The rotation angle Q of magnet 2 is calculated as follows:

$$Q = a\tan(H_{SX}/H_{SY}) = a\tan(\cos\theta \times (H_X/H_Y)) = a\tan(K_S \times (H_X/H_Y)) \quad \text{(formula 12)}$$

$K_S$ is a conversion coefficient for converting the intensity of the magnetic field in the X-axis direction in the X-Y plane into the intensity of the magnetic field in the SX-axis direction in the SX-SY plane and is equal to cos θ. In the present embodiment, $(1/K_s) \times 0.8 \leq MFR \leq (1/K_s) \times 1.2$; preferably $(1/K_s) \times 0.9 \leq MFR \leq (1/K_s) \times 1.1$; and more preferably $(1/K_s) \times 0.95 \leq MFR \leq (1/K_s) \times 1.05$, where $K_s = \cos\theta$. This relationship can be satisfied, for example, by appropriately selecting the position of magnetic field detection element 7.

In the present embodiment, magnetic sensor 1 may be arranged, for example, on motor casing 115 shown by numeral A1 or on the upper surface of sensor housing 4 shown by numeral A2 in FIG. 2, and the same effect as the first embodiment can be obtained.

Third Embodiment

Figure 10A:
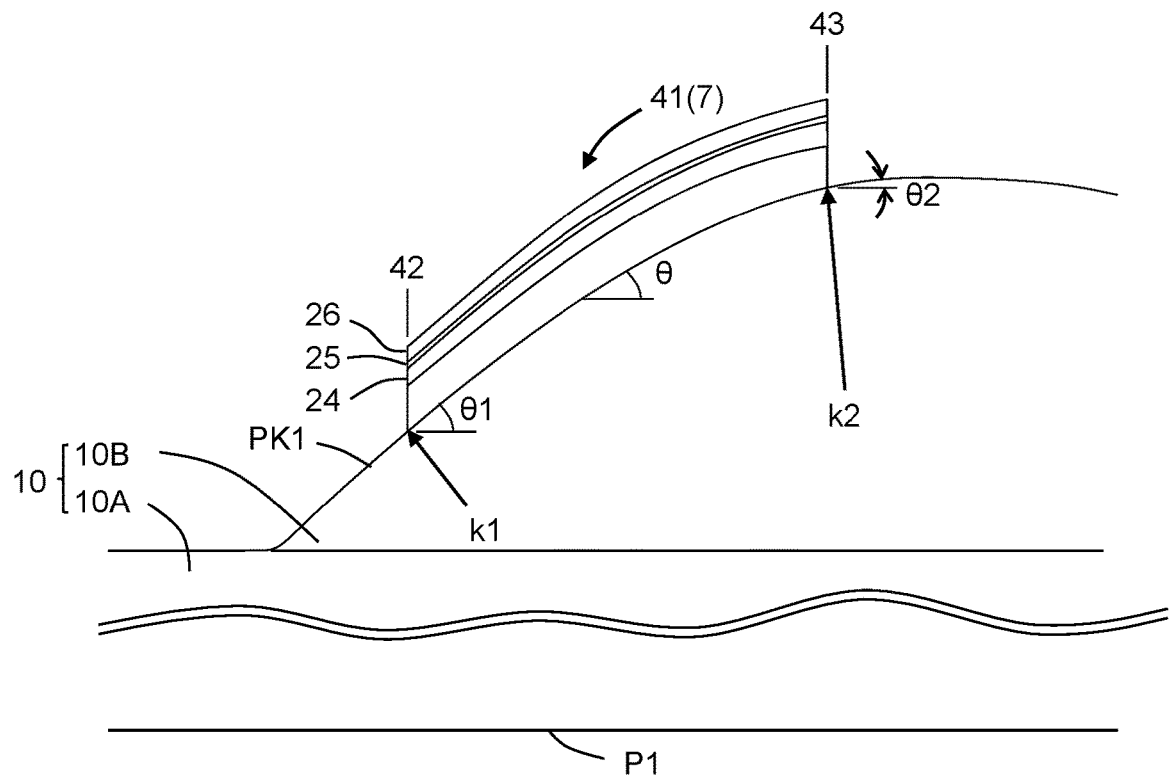
FIGS. 10A and 10B are views schematically illustrating the arrangement of a magnetic field detection element of a third embodiment of the present disclosure.

FIG. 10A is a side view of magnetic field detection element 7 of the third embodiment of the present disclosure. MR element 41 of magnetic field detection element 7 is curved along first slope PK1. First slope PK1 convexly protrudes in a direction away from first side P1. MR element 41 has the same layer configuration as MR elements 21A and 21B. Each layer of MR element 41 is also curved along first slope PK1. Magnetic field detection element 7 has first end 42 that forms first angle θ1 relative to first side P1 and second end 43 that forms second angle θ2 relative to first side P1. Second angle θ2 is smaller than first angle θ1.

In general, the thickness of each layer of an MR element (the dimension in a direction perpendicular to the curved surface) decreases as the angle of the slope increases. Further, the degree of the change in thickness increases as the angle and the curvature of the slope increase. On the other hand, an MR element is typically formed in a specific shape using a photoresist. For this reason, if misalignment or a change in dimensions occurs in the photoresist, then the thickness of each layer of the MR element will easily change where the slope has a large angle or large curvature. In particular, when the thickness of magnetically free layer 26 greatly deviates from the design thickness, the desired characteristics of the MR element may not be obtained.

In the present embodiment, curvature k1 of MR element 41 (magnetic field detection element 7) at first end 42 is smaller than curvature k2 of MR element 41 (magnetic field detection element 7) at second end 43. Specifically, curvature k1 of first slope PK1 is set to be relatively small where a change in the thickness of magnetically free layer 26 is relatively large. Thus, the variation in the thickness of magnetically free layer 26 can be limited near first end 42 compared to first slope PK1 that has a constant curvature or compared to first slope PK1 that has curvature k1 that is larger than curvature k2.

Figure 10B:
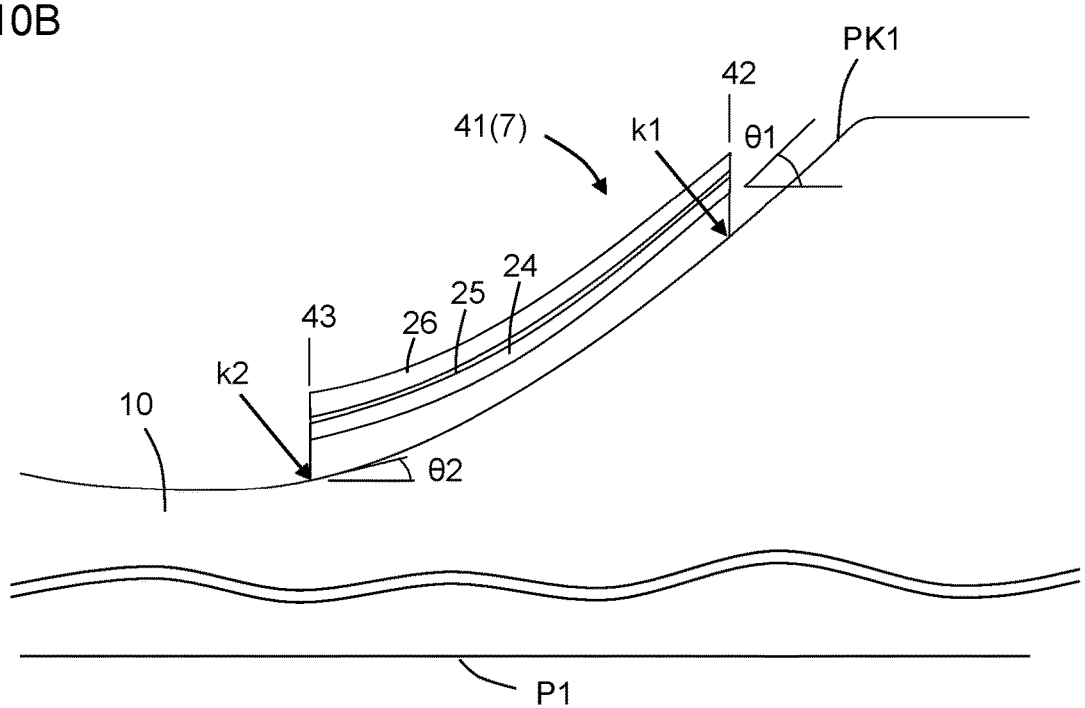

FIG. 10B is a side view of MR element 41 of a modification of the third embodiment. In this modification, first slope PK1 is concavely recessed in a direction toward first side P1. This modification is otherwise the same as the third embodiment.

Fourth Embodiment

Figure 11:
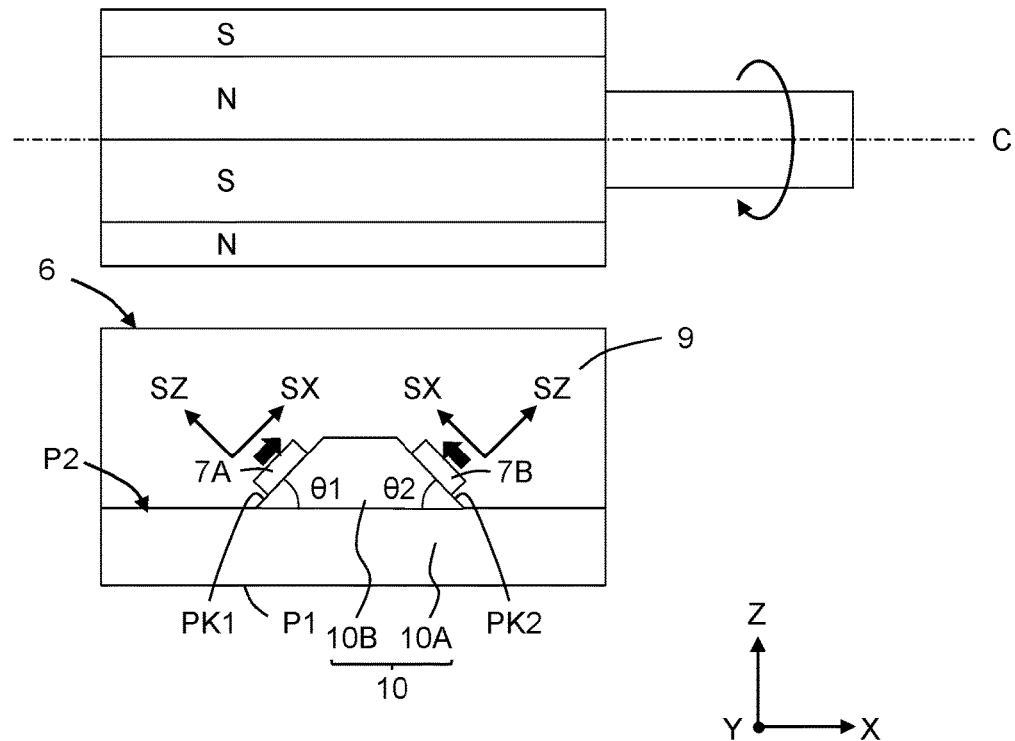
FIG. 11 is a view schematically illustrating the arrangement of a magnetic sensor, a magnet, and a rotating shaft of a fourth embodiment of the present disclosure.
Figure 12:
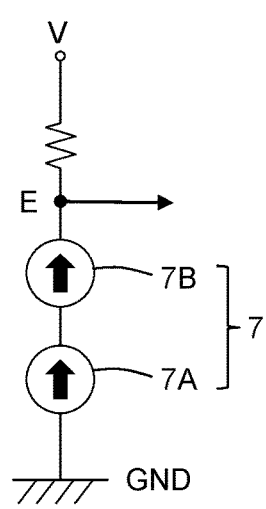
FIG. 12 is a view schematically illustrating electric connections in the magnetic field detection element shown in FIG. 11.

FIG. 11 is a schematic view of magnetic field detection element 7 of the fourth embodiment of the present disclosure and illustrates a side view of base 6, magnet 2, and rotating shaft 3 of magnetic sensor 1. FIG. 12 illustrates electric connections in magnetic sensor 1 of the fourth embodiment. Magnetic field detection element 7 has first and second magnetic field detection elements 7A and 7B. Second side P2 of substrate 10 has first slope PK1 and second slope PK2 that are inclined in opposite directions. First slope PK1 and first side P1 form angle θ1, and second slope PK2 and first side P1 form angle θ2. First magnetic field detection element 7A is provided along first slope PK1 and second magnetic field detection element 7B is provided along second slope PK2. Ks of first magnetic field detection element 7A (hereinafter referred to as Ks1) is sin θ1, and Ks of second magnetic field detection element 7B (hereinafter referred to as Ks2) is sin θ2. Accordingly, the intensity of the magnetic field in the SX-axis direction at first magnetic field detection element 7A is reduced to Ks1×[the intensity of the magnetic field in the Z-axis direction] and the intensity of the magnetic field in the SX-axis direction at second magnetic field detection element 7B is reduced to Ks2×[the intensity of the magnetic field in the Z-axis direction].

The magnetization direction of magnetically pinned layer 24 of first magnetic field detection element 7A and the magnetization direction of magnetically pinned layer 24 of second magnetic field detection element 7B include components of the same direction regarding the Z-axis (an upward component in FIG. 11). First magnetic field detection element 7A and second magnetic field detection element 7B are connected in a series between voltage V and ground GND, and signal output portion E is positioned with first and second magnetic field detection elements 7A and 7B to one side and voltage V to the other. Thus, magnetic field $H_Z$ in the Z-direction is detected as $H_Z \times Ks1$ by first magnetic field detection element 7A, is detected as $H_Z \times Ks2$ by second magnetic field detection element 7B, and is detected as $H_Z \times (Ks1+Ks2) = H_Z \times (\sin\theta1 + \sin\theta2)$ by the entirety of magnetic field detection element 7.

Substrate 10 may be attached such that first side P1 of substrate 10 is inclined with respect to central axis C due to mounting error of magnetic sensor 1 and the like. For example, if substrate 10 is rotated anticlockwise as a whole by angle Δθ in FIG. 11, then Ks1=sin (θ1+Δθ) and Ks2=sin (θ2−Δθ). However, change in (Ks1+Ks2) is limited because Ks1 increases and Ks2 decreases. Accordingly, even when there is mounting error of magnetic sensor 1 in the present embodiment, the mounting error is less likely to affect the error in detecting the angle of magnetic sensor 1. Angle θ1 and angle θ2 are preferably the same, but as can be understood from the description above, θ1=θ2 is not necessary because the above-mentioned effect is also obtained when angle θ1 is different from angle θ2.

The present disclosure has been described with reference to the embodiments, but the present disclosure is not limited to the above-described embodiments. For example, center line 15 of first slope PK1 extends in the Y-direction in the first embodiment but may be inclined with respect to the Y-direction. The rotation angle of a magnet can also be detected in this case because $H_{SX}$ and $H_{SY}$ can be obtained. However, if center line 15 of first slope PK1 extends in the X-direction, then $H_{SX}=0$, and as a result, Q=0 in accordance with formula (6), whereby the rotation angle cannot be detected. Similarly, in the second embodiment as well, center line 15 of first slope PK1 may be inclined with respect to the Y-direction. However, this does not apply in a case in which center line 15 of first slope PK1 extends in the X-direction.

Further, a brake system has been described as an application of the present disclosure, but the present disclosure is not limited to this application. The present disclosure may be applied to a system having a multipole magnet and an angle sensor. The present disclosure may also be applied, for example, to a crown (button) of an electronic watch such as a smartwatch.

As can be understood from the foregoing, the present disclosure can provide a magnetic sensor that can detect the rotation angle of a rotating magnet with reduced error in detecting angles and a simplified mounting structure.

Although certain preferred embodiments of the present invention have been shown and described in detail, it should be understood that various changes and modifications may be made without departing from the spirit or scope of the appended claims.

LIST OF REFERENCE NUMERALS

1 magnetic sensor
2 magnet
3 rotating shaft
5 rotation angle detection apparatus
7, 7A, 7B magnetic field detection element
8 circuit member
10 substrate
15 center line
21A first magneto-resistive effect element (MR element)
21B second magneto-resistive effect element (MR element)
41 magneto-resistive effect element (MR element)
24 magnetically pinned layer
26 magnetically free layer
42 first end
43 second end
101 brake system
108 motor
C central axis
P1 first side
P2 second side
PK1 first slope
PK2 second slope

The invention claimed is:

1. A magnetic sensor comprising:
a first magnetic field detection element that detects a magnetic field that is generated by a magnet that rotates about a central axis; and
a substrate that has a first side and a second side that is a reverse side of the first side, wherein the second side includes a first slope that is inclined with respect to the first side, wherein:
the first magnetic field detection element is provided along the first slope,
the magnet is separated from the central axis and polarities of the magnet alternate in a circumferential direction about the central axis,
the first side is substantially parallel to the central axis,
the first slope is inclined with respect to the first side by an average angle of θ, and
in a plane perpendicular to the central axis, intensity of the magnetic field where the first magnetic field detection element is positioned changes as the magnet rotates, and the relation $(1/Ks) \times 0.8 \leq MFR \leq (1/Ks) \times 1.2 (Ks=\sin \theta)$ is satisfied, where MFR is a ratio of a maximum value to a minimum value of the intensity of the magnetic field in the plane.

2. The magnetic sensor according to claim 1, wherein the first side is parallel to the central axis or an acute angle that is formed between the central axis and a plane that includes the first side is 5 degrees or less.

3. The magnetic sensor according to claim 1, wherein the relation $(1/Ks) \times 0.9 \leq MFR \leq (1/Ks) \times 1.1$ is satisfied.

4. The magnetic sensor according to claim 1, wherein the relation $(1/Ks) \times 0.95 \leq MFR \leq (1/Ks) \times 1.05$ is satisfied.

5. The magnetic sensor according to claim 1, wherein the first magnetic field detection element has first and second magneto-resistive effect elements, wherein each magneto-resistive effect element has a magnetically pinned layer whose magnetization direction is pinned and a magnetically free layer whose magnetization direction changes in accordance with a magnetic field; and
wherein the first slope has four sides and a linear center line that connects midpoints of opposing ones of the sides, the magnetization direction of the magnetically pinned layer of the first magneto-resistive effect element is substantially parallel to the center line, and the magnetization direction of the magnetically pinned layer of the second magneto-resistive effect element is substantially perpendicular to the center line.

6. The magnetic sensor according to claim 1, further comprising:
a circuit member that is electrically connected to the first magnetic field detection element; and
a sensor package that is provided with the substrate, wherein:
the sensor package is supported by the circuit member such that the first side is substantially parallel to the circuit member.

7. The magnetic sensor according to claim 1, wherein the magnetic field detection element is curved along the first slope.

8. The magnetic sensor according to claim 7, wherein:
the first magnetic field detection element has a first end that forms a first angle with respect to the first side and a second end that forms a second angle with respect to the first side, the second angle is smaller than the first angle, and curvature of the first magnetic field detection element at the first end is smaller than curvature of the first magnetic field detection element at the second end.

9. The magnetic sensor according to claim 1, further comprising a second magnetic field detection element that detects a magnetic field that is generated by the magnet, wherein:

the second side has a second slope that is inclined in a direction opposite to the first slope, the second magnetic field detection element is provided along the second slope, and the first magnetic field detection element and the second magnetic field detection element are connected in a series between a voltage and a ground.

10. A magnetic sensor comprising:

a first magnetic field detection element that detects a magnetic field that is generated by a magnet that rotates about a central axis; and a substrate that has a first side and a second side that is a reverse side of the first side, wherein the second side includes a first slope that is inclined with respect to the first side, wherein:

the first magnetic field detection element is provided along the first slope, the magnet is separated from the central axis and polarities of the magnet alternate in a circumferential direction about the central axis, a plane that includes the first side is substantially perpendicular to the central axis, the first slope is inclined with respect to the first side by an average angle of θ, and in a plane perpendicular to the central axis, intensity of the magnetic field where the first magnetic field detection element is positioned changes as the magnet rotates, and the relation $(1/Ks) \times 0.8 \leq MFR \leq (1/Ks) \times 1.2 (Ks = \sin \theta)$ is satisfied, where MFR is a ratio of a maximum value to a minimum value of the intensity of the magnetic field in the plane perpendicular to the central axis.

11. The magnetic sensor according to claim 10, wherein an angle that is formed between the central axis and the plane that includes the first side is 85 degrees or more and 95 degrees or less.

12. A magnetic sensor comprising:

a first magnetic field detection element configured to detect a magnetic field that is generated by a magnet configured to rotate about a central axis; and a substrate that has a first side and a second side that is a reverse side of the first side, wherein the second side includes a first slope that is inclined with respect to the first side, wherein:

the first magnetic field detection element is provided along the first slope, the first side is configured to be substantially parallel to the central axis, the first slope is inclined with respect to the first side by an average angle of θ, and in a plane perpendicular to the central axis, intensity of the magnetic field where the first magnetic field detection element is positioned satisfies the relation $(1/Ks) \times 0.8 \leq MFR \leq (1/Ks) \times 1.2 (Ks = \sin \theta)$ where MFR is a ratio of a maximum value to a minimum value of the intensity of the magnetic field in the plane.

13. A rotation angle detection apparatus comprising:

the magnetic sensor according to claim 12; and the magnet, wherein the magnet is separated from the central axis and polarities of the magnet alternate in a circumferential direction about the central axis, and the intensity of the magnetic field where the first magnetic field detection element is positioned changes as the magnet rotates.

14. A brake system comprising:

the rotation angle detection apparatus according to claim 13; and a motor having a rotating shaft that rotates about the central axis and operates as an electric booster, wherein:

the magnet is attached on a side of the rotating shaft.

* * * * *